US010134677B1

(12) United States Patent
Chang Chien et al.

(10) Patent No.: US 10,134,677 B1
(45) Date of Patent: Nov. 20, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chien Lin Chang Chien, Kaohsiung (TW); Chin-Li Kao, Kaohsiung (TW); Shih-Yu Wang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/596,956

(22) Filed: May 16, 2017

(51) Int. Cl.
*H01L 23/538* (2006.01)
*H01L 21/683* (2006.01)
*H01L 21/48* (2006.01)
*H01L 23/498* (2006.01)

(52) U.S. Cl.
CPC ........ *H01L 23/5384* (2013.01); *H01L 21/486* (2013.01); *H01L 21/4857* (2013.01); *H01L 21/6835* (2013.01); *H01L 23/49816* (2013.01); *H01L 23/49822* (2013.01); *H01L 23/49827* (2013.01); *H01L 23/49838* (2013.01); *H01L 23/5383* (2013.01); *H01L 2221/68345* (2013.01); *H01L 2221/68359* (2013.01)

(58) Field of Classification Search
CPC .......... H01L 23/5384; H01L 23/49827; H01L 23/49822; H01L 21/6835; H01L 23/49816; H01L 23/49838; H01L 2221/68359; H01L 2221/68345; H01L 21/4857; H01L 2221/68304; H01L 2221/68372; H01L 21/486
See application file for complete search history.

(56) References Cited

U.S. PATENT DOCUMENTS

| 2009/0065949 | A1* | 3/2009 | Yim ..................... H01L 25/105 257/777 |
| 2012/0261838 | A1 | 10/2012 | Braunisch et al. |
| 2015/0084206 | A1* | 3/2015 | Lin ..................... H01L 23/3135 257/774 |
| 2015/0171024 | A1* | 6/2015 | Choi et al. ........... H01L 23/562 438/113 |

* cited by examiner

*Primary Examiner* — Jasmine Clark
(74) *Attorney, Agent, or Firm* — Foley & Lardner LLP; Cliff Z. Liu

(57) ABSTRACT

A semiconductor package device includes a first interconnection structure, a non-silicon interposer and a first die. The first interconnection structure has a first pitch. The non-silicon interposer surrounds the first interconnection structure. The non-silicon interposer includes a second interconnection structure having a second pitch. The second pitch is larger than the first pitch. The first die is above the first interconnection structure and is electrically connected to the first interconnection structure.

18 Claims, 17 Drawing Sheets

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including a stacking structure and a method of manufacturing the same.

2. Description of the Related Art

In comparable three-dimensional semiconductor packages, there is a bridge in an interposer (e.g., a through silicon via (TSV) interposer) to provide electrical interconnection (e.g., via a redistribution layer (RDL)) between two dies (such as an application-specific integrated circuit (ASIC) and a high bandwidth memory (HBM)). However, fine pitch (e.g., smaller than 1 micrometer (μm)) interconnection exists in a small portion of the interposer (e.g., the area between the two dies). Most of the regions of the interposer are designed for interconnection with relatively great pitch (e.g., greater than 1 μm). However, it may take great cost to use the TSV interposer to provide electrical interconnection between the two dies.

SUMMARY

In one or more embodiments, a semiconductor package device includes a first interconnection structure, a non-silicon interposer and a first die. The first interconnection structure has a first pitch. The non-silicon interposer surrounds the first interconnection structure. The non-silicon interposer includes a second interconnection structure having a second pitch. The second pitch is larger than the first pitch. The first die is above the first interconnection structure and is electrically connected to the first interconnection structure.

In one or more embodiments, a semiconductor system includes a fan-out semiconductor package device. The fan-out semiconductor package device includes a first interconnection structure having a first pitch, a non-silicon interposer surrounding the first interconnection structure and having a second interconnection structure with a second pitch, a first die electrically connected to the fan-out semiconductor package, and a second die electrically connected to the first die through the fan-out semiconductor package.

In one or more embodiments, a method of manufacturing a semiconductor package device includes providing a carrier and a release film, disposing a first interconnection structure and a silicon base on the carrier, disposing a non-silicon interposer over the first interconnection structure, disposing a second interconnection structure over the first interconnection structure and the non-silicon interposer, connecting a first die to the second interconnection structure, and connecting a second die to the second interconnection structure.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
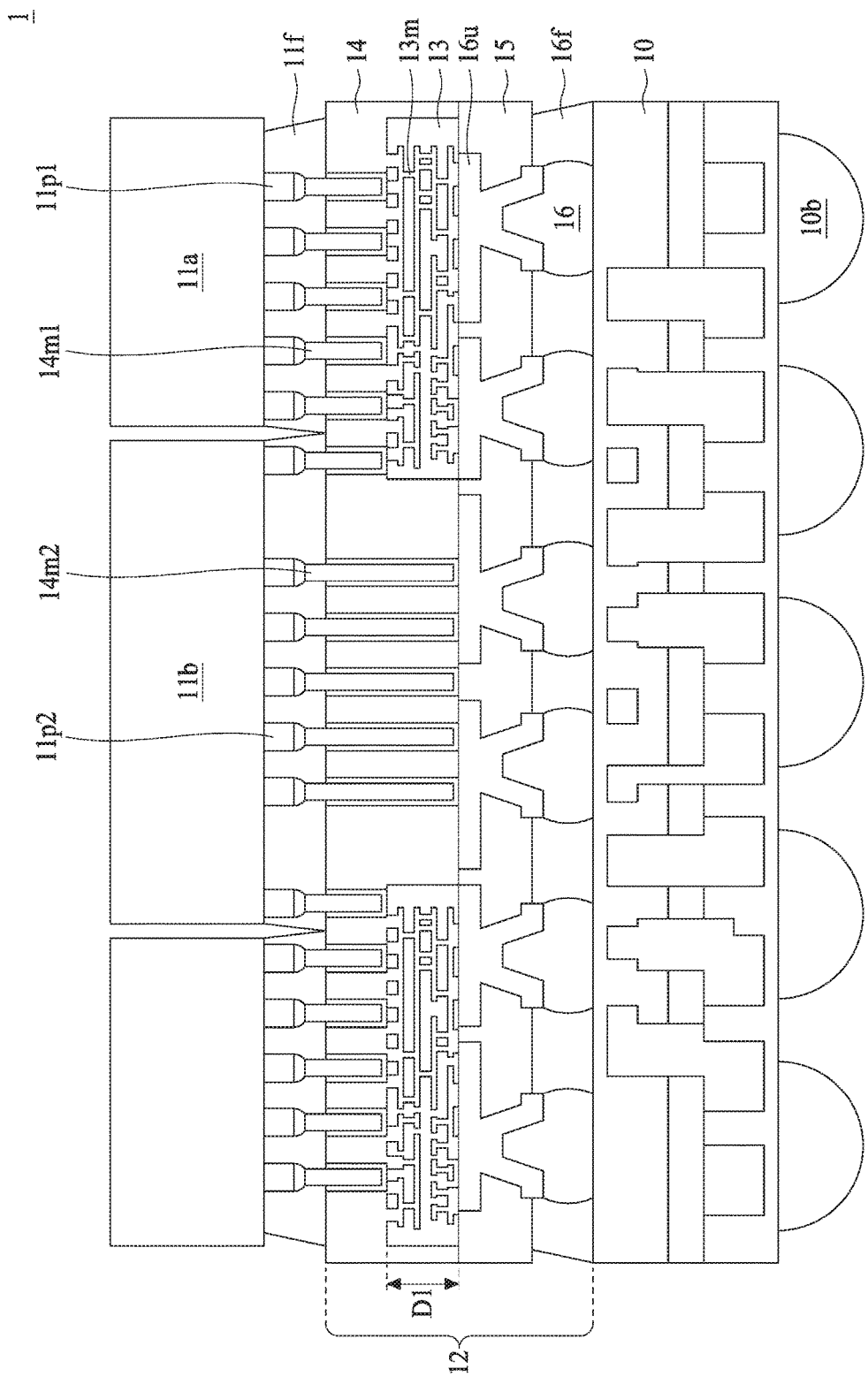
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes a substrate 10, electronic components 11a, 11b and an interconnection component 12.

The substrate 10 may be a flexible substrate or a rigid substrate, depending upon the specific application. In some embodiments, the substrate 10 includes a plurality of electrical traces disposed therein. In some embodiments, an external contact layer is also formed or disposed on the substrate 10. In some embodiments, the external contact layer includes a ball grid array (BGA). In other embodiments, the external contact layer includes an array such as, but not limited to, a land grid array (LGA) or an array of pins (PGA). In some embodiments, the external contact layer includes solder balls 10b, which are used and are composed of lead or are lead free (e.g., including such materials as alloys of gold and tin solder or silver and tin solder).

Electronic components 11a, 11b are disposed over the substrate 10. Each of the electronic components 11a, 11b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnections. The electronic components 11a, 11b may be any suitable integrated circuit device including, but not limited to, a microprocessor (e.g., single or multi-core), a memory device, a chipset, a graphics device, or an application-specific integrated circuit (ASIC) according to several different embodiments. In some embodiments, the electronic component 11a is a high bandwidth memory (HBM) and the electronic component 11b is an ASIC.

Each of the electronic components 11a, 11b includes a plurality of electrical contacts 11p1, 11p2 to provide electrical connections between the electronic components 11a, 11b and other electronic components. In some embodiments, the electrical contacts 11p1, 11p2 and the active sides of the electronic components 11a, 11b are covered or encapsulated by an underfill 11f. In some embodiments, the underfill 11f includes an epoxy resin, a molding compound (e.g., an epoxy molding compound or other molding compound), a polyimide, a phenolic compound or material, a material including a silicone dispersed therein, or a combination thereof.

The interconnection component 12 is disposed between the electronic components 11a, 11b and the substrate 10 to provide electrical connections therebetween. In some embodiments, the interconnection component 12 is a fan-out structure. The interconnection component 12 includes a first interconnection layer 14, a second interconnection layer 13, a passivation layer 15 and electrical contacts 16.

The first interconnection layer 14 includes electrical contacts (such as micro-pads) to which the electronic components 11a, 11b are electrically connected. In some embodiments, the first interconnection layer 14 is a dielectric layer or a non-silicon interposer (e.g., an organic interposer) and includes a plurality of conductive connections 14m1, 14m2 embedded therein. In some embodiments, the conductive connection 14m2 is referred to as a second interconnection structure, and the conductive connection 14m1 is referred to as a second interconnection structure or a third interconnection structure. The first interconnection layer 14 covers or encapsulates the second interconnection layer 13. For example, the first interconnection layer 14 is disposed on and adjacent to the second interconnection layer 13.

The second interconnection layer 13 (e.g., also referred to as a first interconnection structure) includes a plurality of conductive connections (or a redistribution layer (RDL)) 13m therein. A portion of the conductive connections 14m1 of the first interconnection layer 14 is electrically connected to the conductive connections 13m of the second interconnection layer 13. For example, the conductive connections 14m1 that are electrically connected to the electronic components 11a, 11b are electrically connected to the conductive connections 13m of the second interconnection layer 13. The second interconnection layer 13 provides interconnections between the electronic components 11a and 11b. For example, the second interconnection layer 13 can serve as a bridge between the electronic components 11a and 11b.

In some embodiments, the pitch (e.g., the line width and line space (L/S)) of the conductive connection 13m of the second interconnection layer 13 is less than that of the conductive connections 14m1, 14m2 of the first interconnection layer 14. For example, the conductive connection 13m of the second interconnection layer 13 is a fine-pitch interconnection or fine line (e.g., less than about 1 micrometer (μm)), and the conductive connections 14m1, 14m2 of the first interconnection layer 14 are coarse-pitch interconnections or coarse lines (e.g., greater than about 1 μm). In some embodiments, a thickness D1 of the second interconnection layer 13 is in a range from about 10 μm to about 20 μm. In some embodiments, a density of the second interconnection layer 13 is larger than a density of the conductive connections 14m1, 14m2. In some embodiments, a top surface of the conductive connection 14m1 is substantially coplanar with a top surface of the conductive connection 14m2. In some embodiments, a diameter of the conductive connection 14m1 is less than a diameter of the conductive connection 14m2.

In comparable semiconductor package devices, an interposer (e.g., a through silicon via (TSV) interposer) is used to provide electrical interconnections between two dies. However, fine-pitch interconnection may be used in a small portion of the interposer (e.g., the area between two dies). Most of the regions of the interposer are designed for interconnection with relatively great pitch. Therefore, it may take great cost to use the TSV interposer to provide electrical interconnections. In accordance with some embodiments, the fine-pitch interconnection (e.g., the conductive connection 13m of the second interconnection layer 13) is provided at a predetermined area (e.g., the area between the electronic components 11a and 11b), and the remaining area is provided with coarse-pitch interconnections (e.g., the conductive connections 14m1, 14m2). For example, the fine-pitch interconnection structure is embedded within the coarse-pitch interconnection structure. Therefore, it is unnecessary to use a TSV interposer to provide interconnections between two dies, which would reduce the thickness of the semiconductor package device and the manufacturing cost.

The first interconnection layer 14 and the second interconnection layer 13 are disposed on the passivation layer 15. The passivation layer 15 encapsulates or covers a portion of the first interconnection layer 14 and the second interconnection layer 13 and exposes conductive contacts of the first interconnection layer 14 and the second interconnection layer 13. In some embodiments, the passivation layer 15 includes silicon oxide, silicon nitride, gallium oxide, aluminum oxide, scandium oxide, zirconium oxide, lanthanum oxide or hafnium oxide.

A conductive layer 16u (e.g., under bump metallurgy (UBM)) contacts the exposed portions of the conductive contacts of the first interconnection layer 14 and the second interconnection layer 13. The electrical contacts 16 electrically contact the conductive layer 16u. The first interconnection layer 14 and the second interconnection layer 13 are electrically connected to the substrate 10 through electrical contacts 16 (such as Controlled Collapse Chip Connection (C4) pads). In some embodiments, the electrical contacts 16 can be covered or encapsulated by an underfill 16f.

Figure 2A:
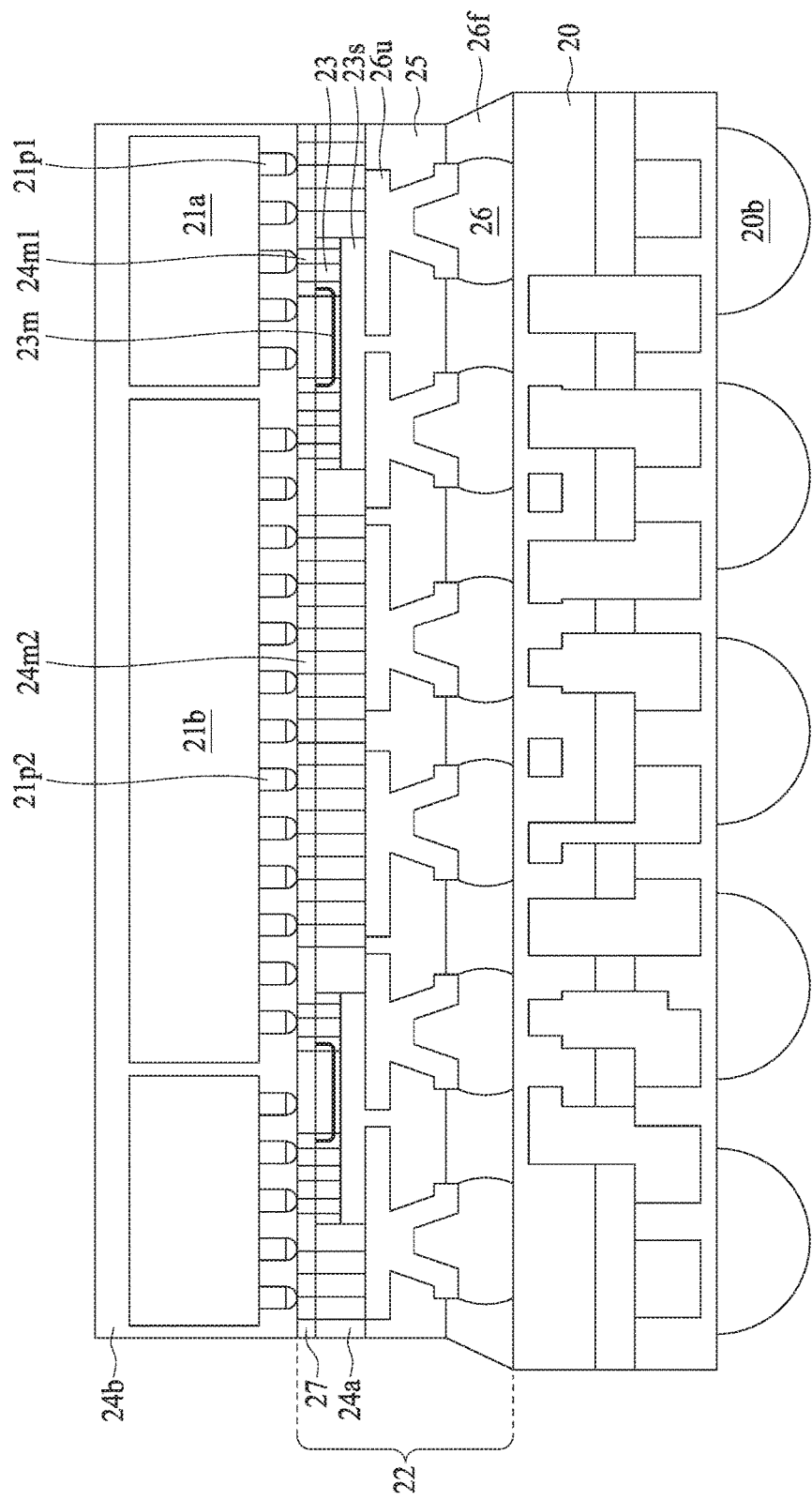
FIG. 2A illustrates a cross-sectional view of a semiconductor package device in accordance with some embodiments of the present disclosure.

FIG. 2A illustrates a cross-sectional view of a semiconductor package device 2A in accordance with some embodiments of the present disclosure. The semiconductor package device 2A includes a substrate 20, electronic components 21a, 21b and an interconnection component 22.

The substrate 20 may be a flexible substrate or a rigid substrate, depending upon the specific application. In some embodiments, the substrate 20 includes a plurality of electrical traces disposed therein. In some embodiments, an external contact layer is also formed or disposed on the substrate 20. In some embodiments, the external contact layer includes a BGA. In other embodiments, the external contact layer includes an array, such as, but not limited to, an LGA or a PGA. In some embodiments, the external contact layer includes solder balls 20b, which are used and are composed of lead or are lead free (e.g., including such materials as alloys of gold and tin solder or silver and tin solder).

Electronic components 21a, 21b are disposed over the substrate 20. Each of the electronic components 21a, 21b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnections. The electronic components 21a, 21b may be any suitable integrated circuit device including, but not limited to, a microprocessor (e.g., single or multi-core), a memory device, a chipset, a graphics device, or an ASIC according to several different embodiments. In some embodiments, the electronic component 21a is an HBM and the electronic component 21b is an ASIC.

Each of the electronic components 21a, 21b includes a plurality of electrical contacts 21p1, 21p2 to provide electrical connections between the electronic components 21a, 21b and other electronic components. In some embodiments, the electronic components 21a, 21b are covered or encapsulated by a package body 24b. In some embodiments, the package body 24b includes an epoxy resin including filler therein, a molding compound (e.g., an epoxy molding compound or other molding compound), a polyimide, a phenolic compound or material, a material including a silicone dispersed therein, or a combination thereof.

The interconnection component 22 is disposed between the electronic components 21a, 21b and the substrate 20 to provide electrical connections therebetween. In some embodiments, the interconnection component 22 is a fan-out structure. The interconnection component 22 includes an interconnection layer 23, a package body 24a, a passivation layer 25, a dielectric layer 27 and electrical contacts 26.

The package body 24a includes a plurality of conductive connections 24m1, 24m2 embedded therein. In some embodiments, the conductive connection 24m2 is referred to as a second interconnection structure, and the conductive connection 24m1 is referred to as a third interconnection structure. The package body 24a covers or encapsulates the interconnection layer 23. For example, the package body 24a is disposed on and adjacent to the interconnection layer 23. The dielectric layer 27 is disposed on the package body 24a and includes electrical contacts (such as micro-pads) to which the electronic components 21a, 21b are electrically connected.

The interconnection layer 23 (e.g., also referred to as a first interconnection structure) is disposed on a silicon layer 23s. The interconnection layer 23 includes a plurality of conductive connections 23m therein. A portion of the conductive connections 24m1 is electrically connected to the conductive connection 23m of the interconnection layer 23. For example, the conductive connections 24m1 that are electrically connected to the electronic components 21a, 21b are electrically connected to the conductive connection 23m of the interconnection layer 23. The interconnection layer 23 provides interconnections between the electronic components 21a and 21b. For example, the interconnection layer 23 can serve as a bridge between the electronic components 21a and 21b.

In some embodiments, the pitch (e.g., the L/S) of the conductive connection 23m of the interconnection layer 23 is less than that of the conductive connections 24m1, 24m2 embedded within the package body 24a. For example, the conductive connection 23m of the interconnection layer 23 is a fine-pitch interconnection or fine line (e.g., less than about 1 µm), and the conductive connections 24m1, 24m2 within the package body 24a are coarse-pitch interconnections or coarse lines (e.g., greater than about 1 µm).

In comparable semiconductor package devices, an interposer (e.g., a TSV interposer) is used to provide electrical interconnections between two dies. However, fine-pitch interconnection is used in a small portion of the interposer (e.g., the area between the two dies). Most of the regions of the interposer are designed for interconnection with relatively great pitch. Therefore, it may take great cost to use the TSV interposer to provide electrical interconnections. In accordance with some embodiments, the fine-pitch interconnection (e.g., the conductive connection 23m of the interconnection layer 23) is provided at a predetermined area (e.g., the area between the electronic components 21a and 21b), and the remaining area is provided with coarse-pitch interconnection (e.g., the conductive connections 24m1, 24m2). For example, the fine-pitch interconnection structure is embedded within the coarse-pitch interconnection structure. Therefore, it is unnecessary to use a TSV interposer to provide interconnections between the two dies, which would reduce the thickness of the semiconductor package device and the manufacturing cost.

The package body 24a and the silicon layer 23s are disposed on the passivation layer 25. The passivation layer 25 encapsulates or covers a portion of the package body 24a and the silicon layer 23s and exposes the conductive connections 24m2 and the silicon layer 23s. In some embodiments, the passivation layer 25 includes silicon oxide, silicon nitride, gallium oxide, aluminum oxide, scandium oxide, zirconium oxide, lanthanum oxide or hafnium oxide.

A conductive layer 26u (e.g., UBM) contacts the exposed portions of the conductive connections 24m2 and the silicon layer 23s. The electrical contacts 26 electrically contact the conductive layer 26u. The conductive connections 24m2 and the silicon layer 23s are electrically connected to the substrate 20 through electrical contacts 26 (such as C4 pads). In some embodiments, the electrical contacts 26 can be covered or encapsulated by an underfill 26f.

Figure 2B:
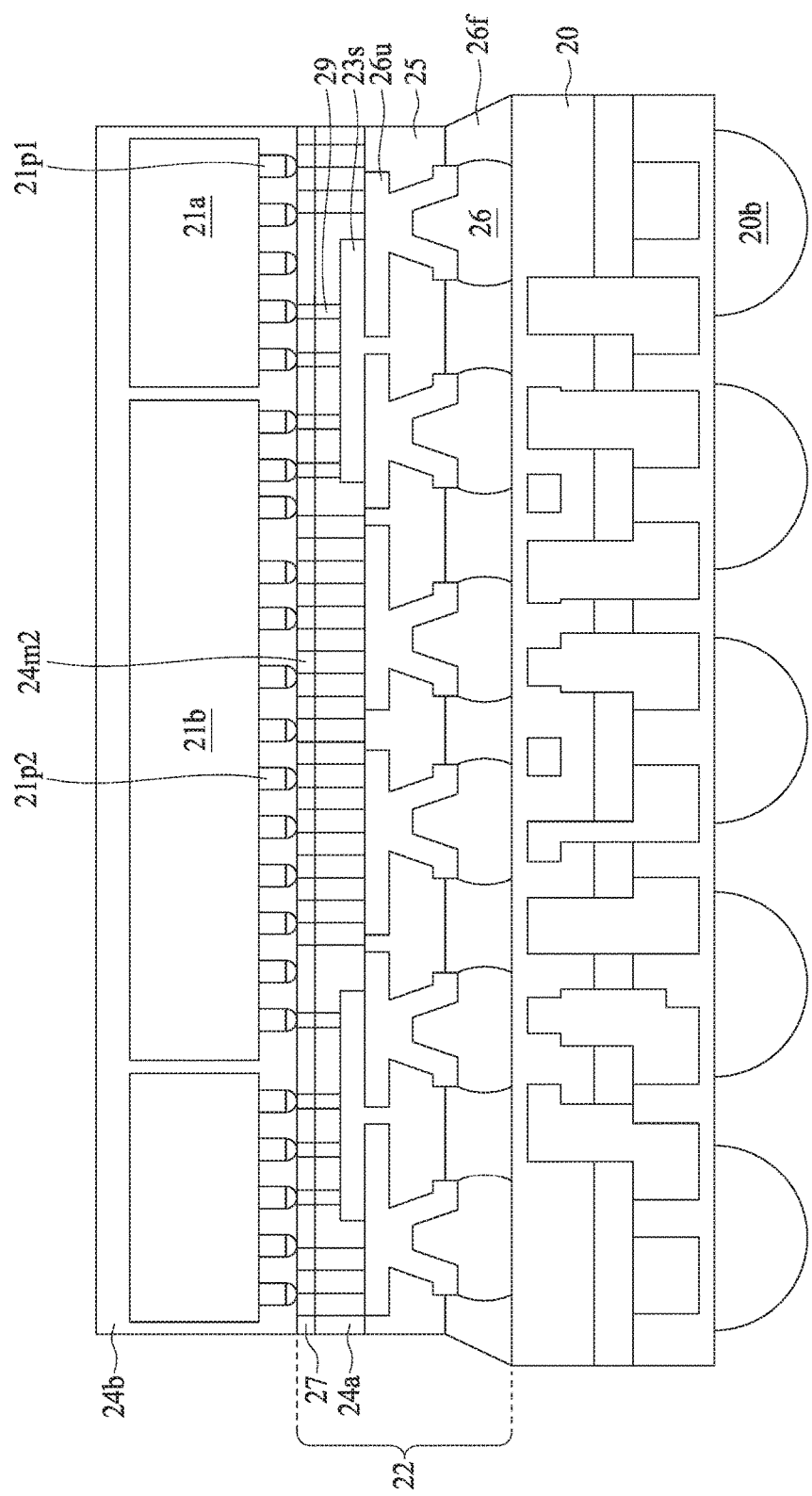
FIG. 2B illustrates a cross-sectional view of a semiconductor package device in accordance with some embodiments of the present disclosure.

FIG. 2B illustrates a cross-sectional view of a semiconductor package device 2B in accordance with some embodiments of the present disclosure. The semiconductor package device 2B is similar to the semiconductor package device 2A except that in FIG. 2B, the interconnection layer 23 is replaced by a plurality of metal pillars 29.

The metal pillars 29 are electrically connected to the electronic components 21a, 21b through conductive contacts within the dielectric layer 27. The metal pillars 29 provide interconnections between the electronic components 21a and 21b. For example, the conductive pillars 29 can serve as a bridge between the electronic components 21a and 21b. In some embodiments, the pitch (e.g., the L/S) of the metal pillar 29 is less than the conductive connection 24m2 embedded within the package body 24a. In some embodiments, the metal pillars 29 include copper studs.

FIGS. 3A, 3B, 3C, 3D, 3E, 3F, 3G and 3H illustrate cross-sectional views of a semiconductor structure fabricated at various stages, in accordance with some embodiments of the present disclosure. Various figures have been simplified for a better understanding of the aspects of the present disclosure.

Figure 3A:
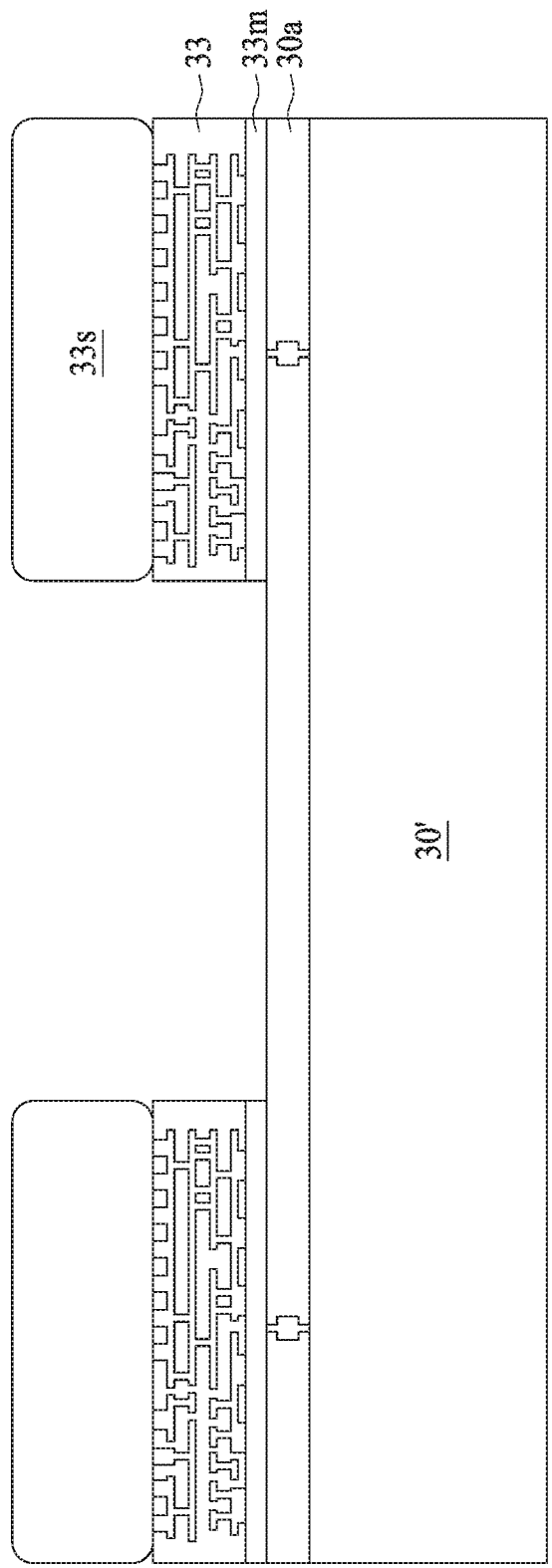
FIG. 3A, FIG. 3B, FIG. 3C, FIG. 3D, FIG. 3E, FIG. 3F, FIG. 3G and FIG. 3H illustrate a method of manufacturing a semiconductor package device in accordance with some embodiments of the present disclosure.

Referring to FIG. 3A, a carrier 30' is provided. In some embodiments, the carrier 30' may be a glass carrier or any other type of suitable carrier. An interconnection layer 33 is disposed over the carrier 30'. In some embodiments, the interconnection layer 33 is attached to the carrier 30' through an adhesive layer (or a release film) 30a on the carrier 30'. In some embodiments, the interconnection layer 33 does not completely cover the carrier 30'. For example, the interconnection layer 33 covers a portion of the carrier 30' and exposes another portion of the carrier 30'.

The interconnection layer 33 includes a plurality of conductive connections therein. In some embodiments, the conductive connections of the interconnection layer 33 are fine-pitch interconnections or fine lines (e.g., less than about 1 µm). The interconnection layer 33 includes a silicon layer 33s disposed thereon. In some embodiments, a metal layer 33m is disposed between the interconnection layer 33 and the carrier 30'. The metal layer 33m may include, for example, titanium (Ti), copper (Cu), tin-silver (SnAg) or other suitable metals or alloys.

Figure 3B:
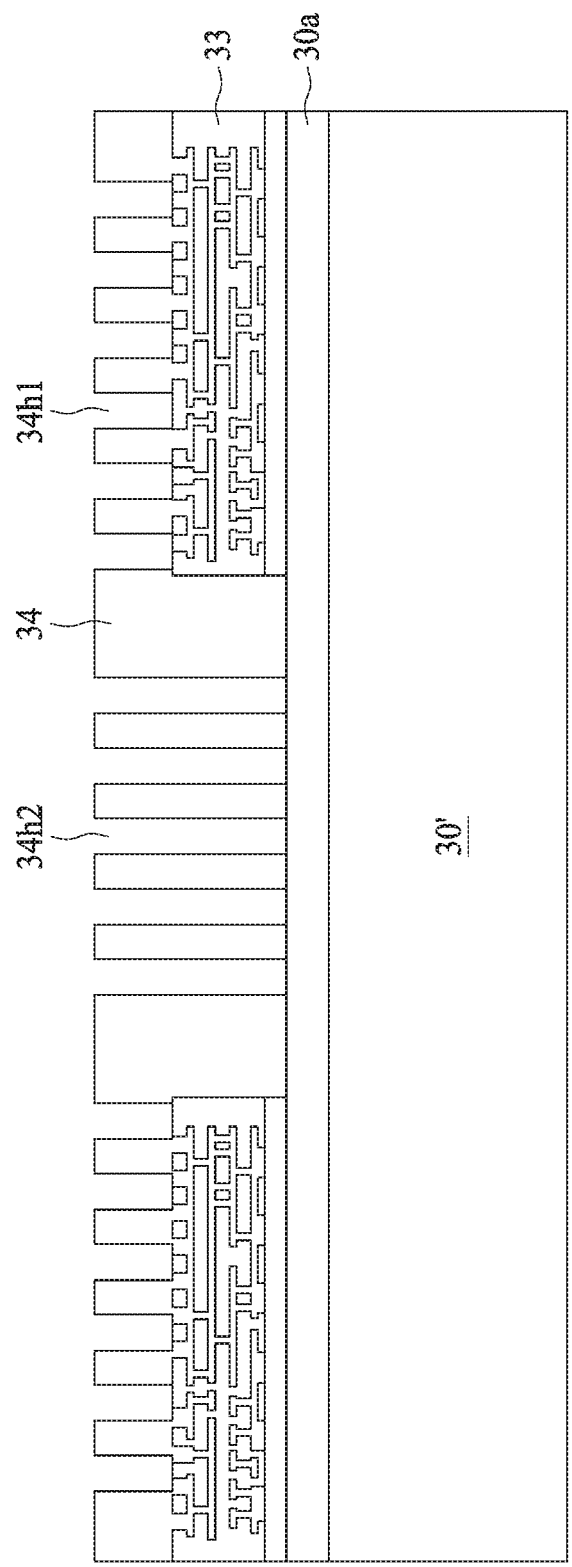

Referring to FIG. 3B, the silicon layer 33s is removed from the interconnection layer 33. In some embodiments, the silicon layer 33s can be removed by etching or by other suitable processes.

A dielectric layer 34 is formed or disposed on the interconnection layer 33 and the portion of the carrier 30' exposed from the interconnection layer 33. The dielectric layer 34 includes a plurality of openings 34h1, 34h2 to expose a portion of the interconnection layer 33 and a portion of the carrier 30' (or adhesive layer 30a). For example, the opening 34h1 exposes the conductive connections of the interconnection layer 33. In some embodiments, the dielectric layer 34 is formed by bumping or by other suitable processes.

Figure 3C:
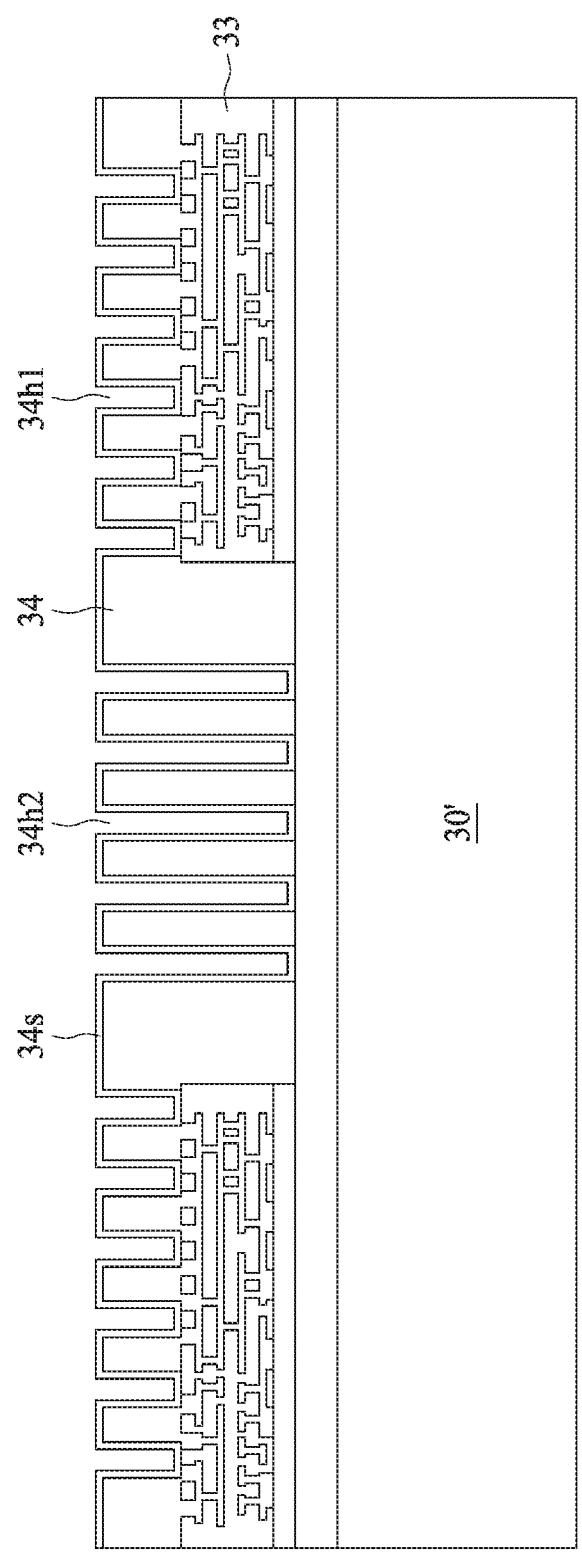

Referring to FIG. 3C, a seed layer 34s is formed or disposed on the dielectric layer 34 and within the openings 34h1, 34h2. For example, the seed layer 34s is formed or disposed on a top surface of the dielectric layer 34 and sidewalls of each opening 34h1, 34h2. In some embodiments, the seed layer 34s is formed of Ti, Cu or other suitable metals or alloys.

Figure 3D:
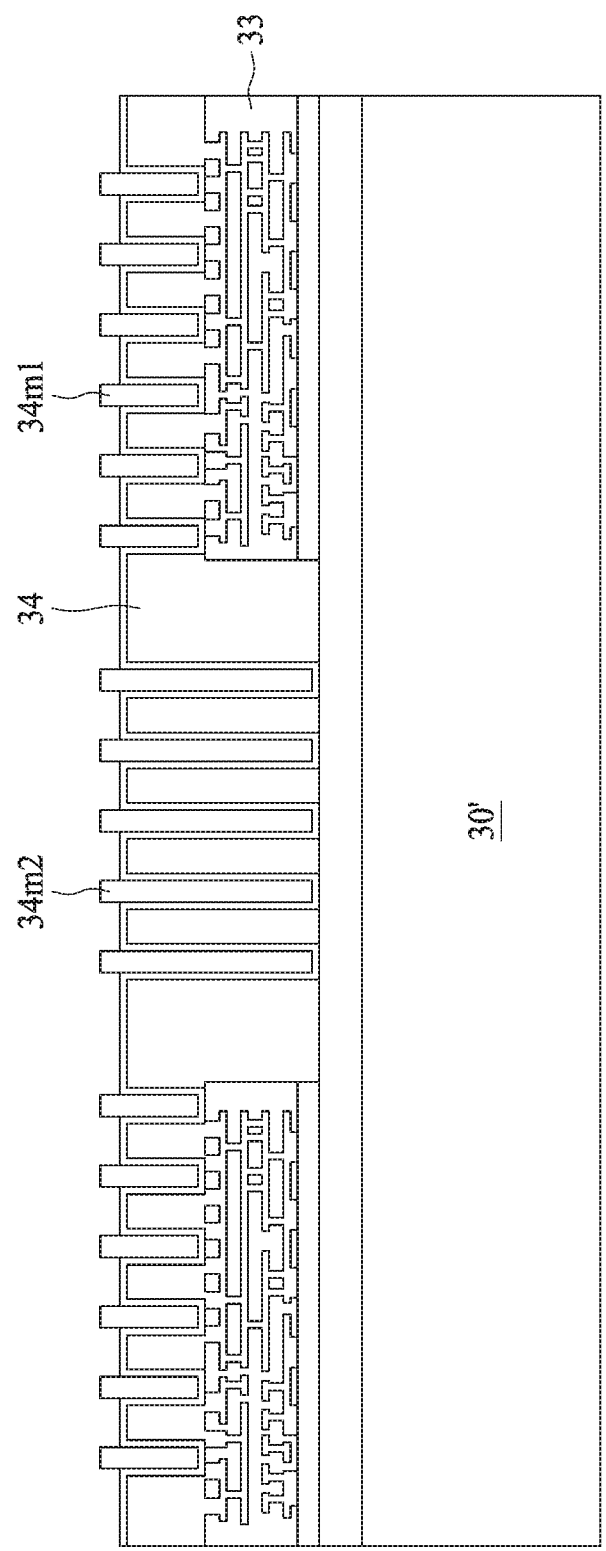

Referring to FIG. 3D, conductive materials are formed or disposed within the openings 34h1, 34h2 to form conductive connections (or conductive pillars) 34m1, 34m2. The conductive connection 34m1 electrically connects to the conductive connection of the interconnection layer 33 that is exposed from the dielectric layer 34. In some embodiments, the conductive connections 34m1, 34m2 are formed by electroplating or by other suitable techniques. In some embodiments, the conductive connections 34m1, 34m2 are coarse-pitch interconnections or coarse lines (e.g., less than about 1 µm).

Figure 3E:
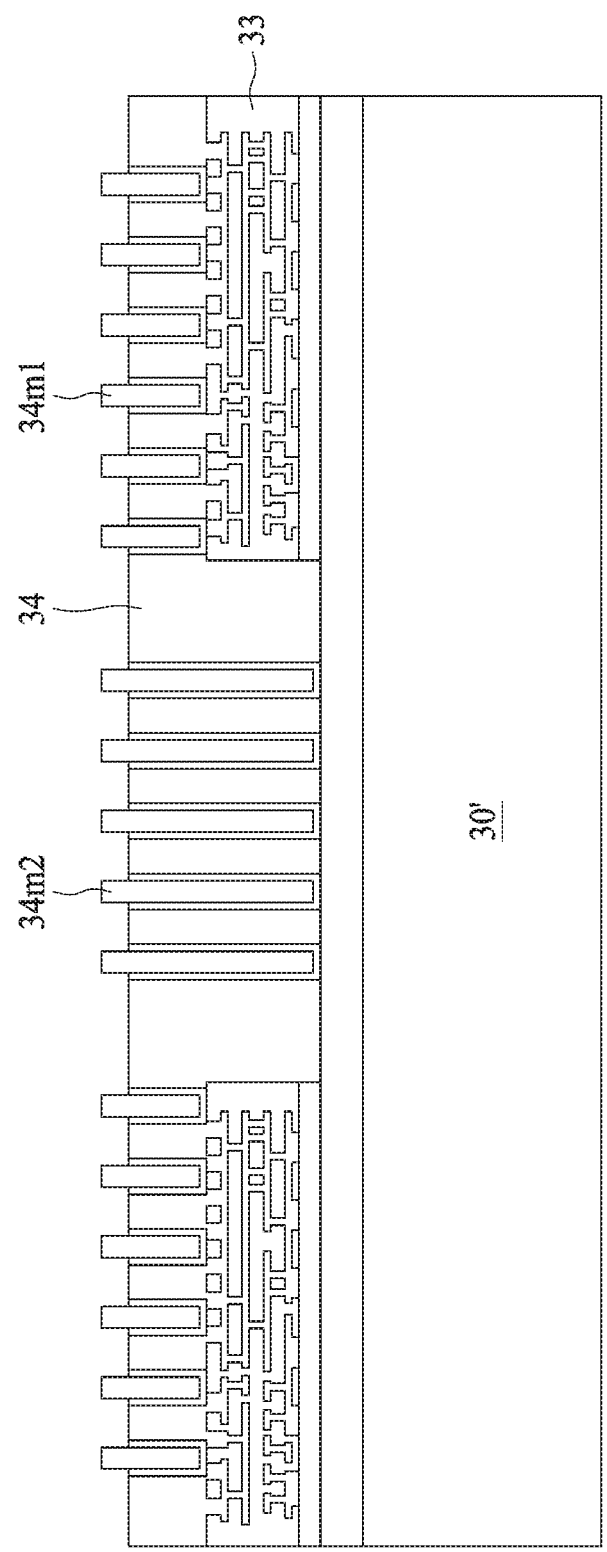

Referring to FIG. 3E, the seed layer 34s is removed from the top surface of the dielectric layer 34. In some embodiments, the seed layer 34s is removed by etching or by other suitable processes.

Figure 3F:
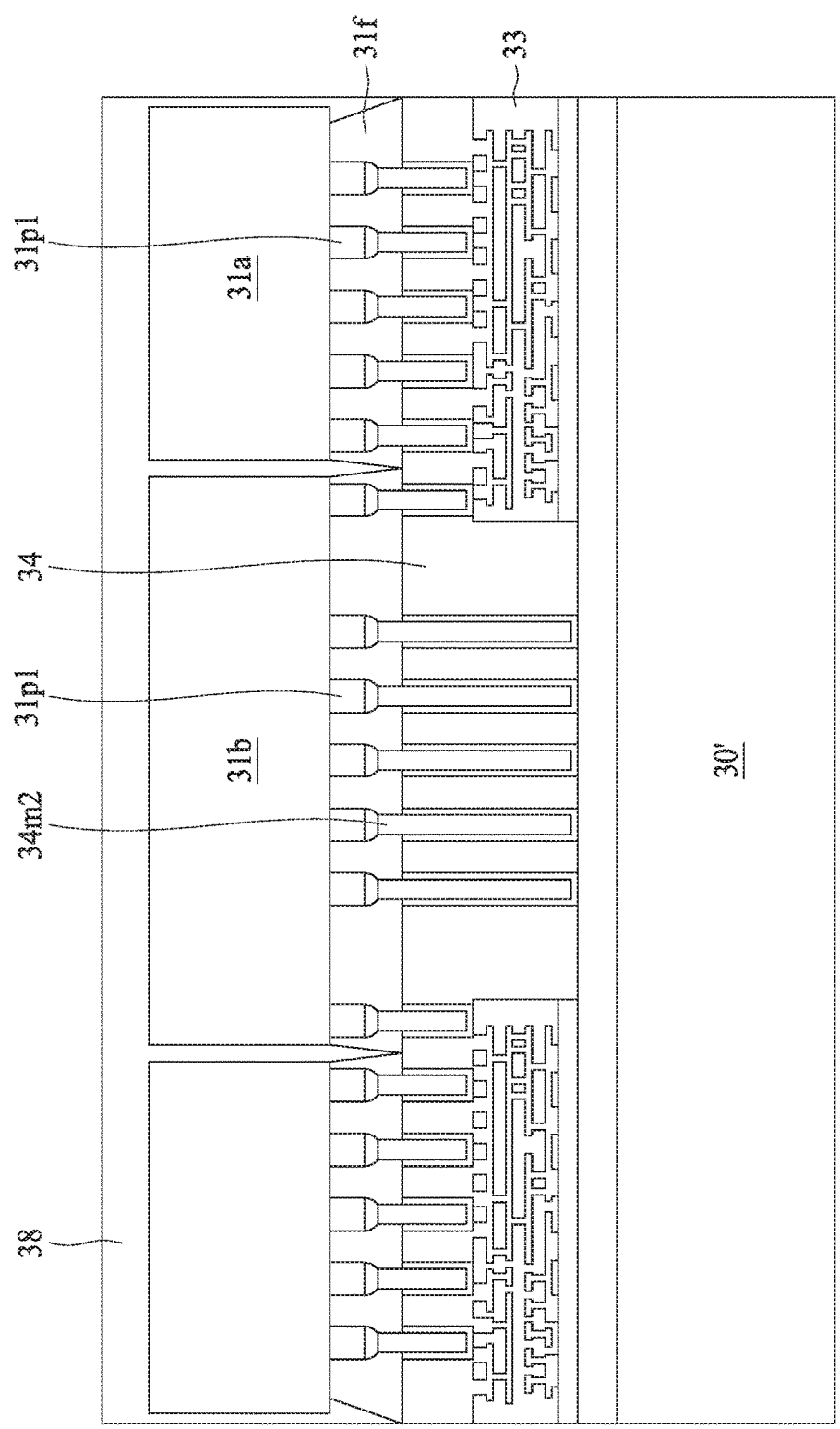

Referring to FIG. 3F, electronic components 31a, 31b are formed or disposed on the dielectric layer 34 and electrically connected to the conductive connections 34m1, 34m2. Each of the electronic components 31a, 31b includes a plurality of electrical contacts 31p1, 31p2 to provide electrical connections between the electronic components 31a, 31b and conductive connections 34m1, 34m2. The electronic components 31a, 31b may be any suitable integrated circuit device including, but not limited to, a microprocessor (e.g., single or multi-core), a memory device, a chipset, a graphics device, or an ASIC according to several different embodiments. In some embodiments, the electronic component 31a is an HBM and the electronic component 31b is an ASIC.

An underfill 31f is formed or disposed to cover or encapsulate the active side of the electronic components 31a, 31b and electrical contacts 31p1, 31p2, and then a reflow process may be carried out. A package body 38 is then formed or disposed to cover or encapsulate the electronic components 31a, 31b. In some embodiments, the package body 38 includes an epoxy resin including fillers, a molding compound (e.g., an epoxy molding compound or other molding compound), a polyimide, a phenolic compound or material, a material including a silicone dispersed therein, or a combination thereof.

Figure 3G:
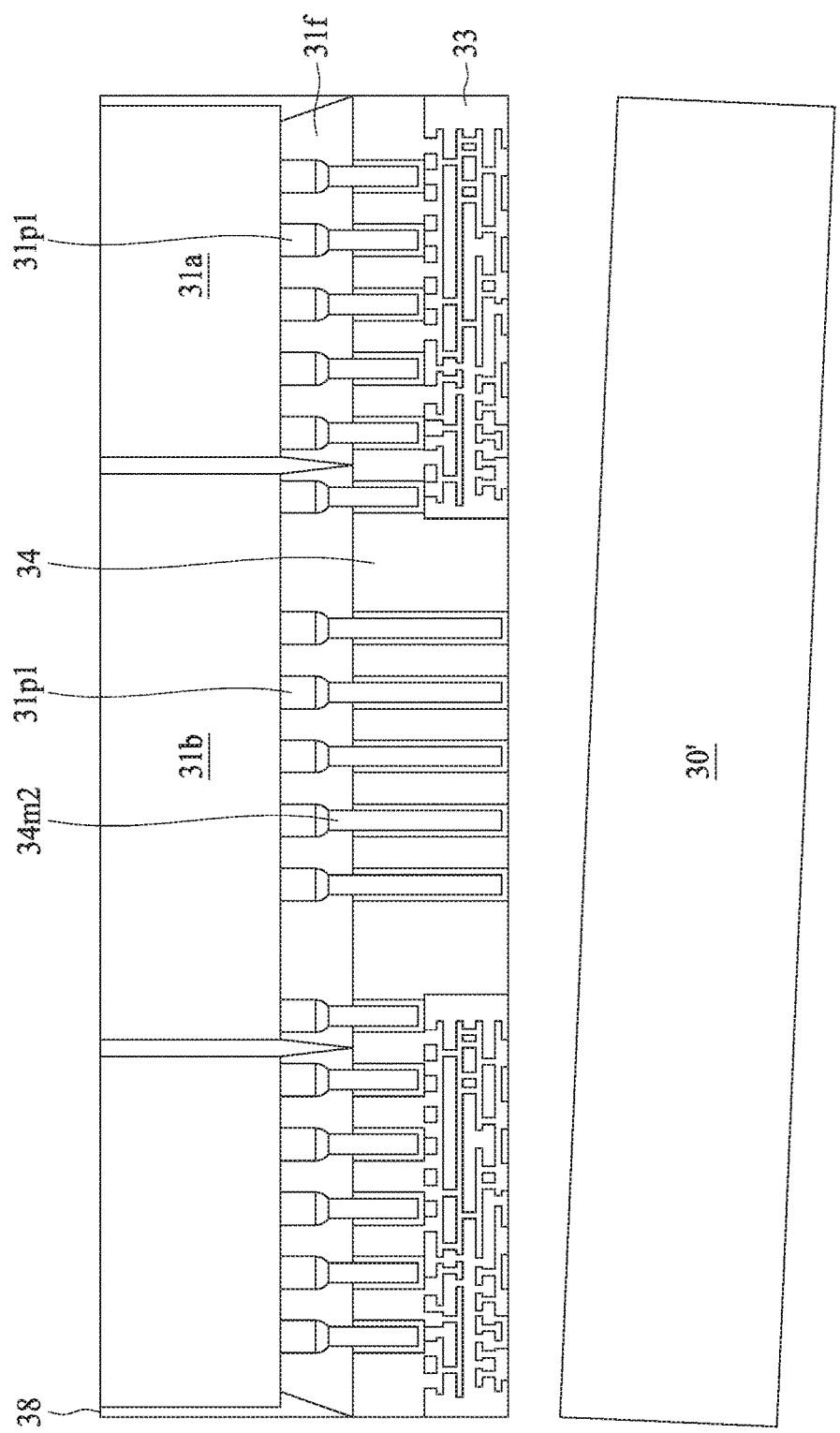

Referring to FIG. 3G, a portion of the package body 38 is removed so that a backside of each electronic component 31a, 31b is exposed from the package body 38. In some embodiments, the package body 38 can be removed by grinding, etching or by other suitable processes. The carrier 30' is then removed from the dielectric layer 34 and the interconnection layer 33 to expose the conductive connections 34m2 and the interconnection layer 33.

Figure 3H:
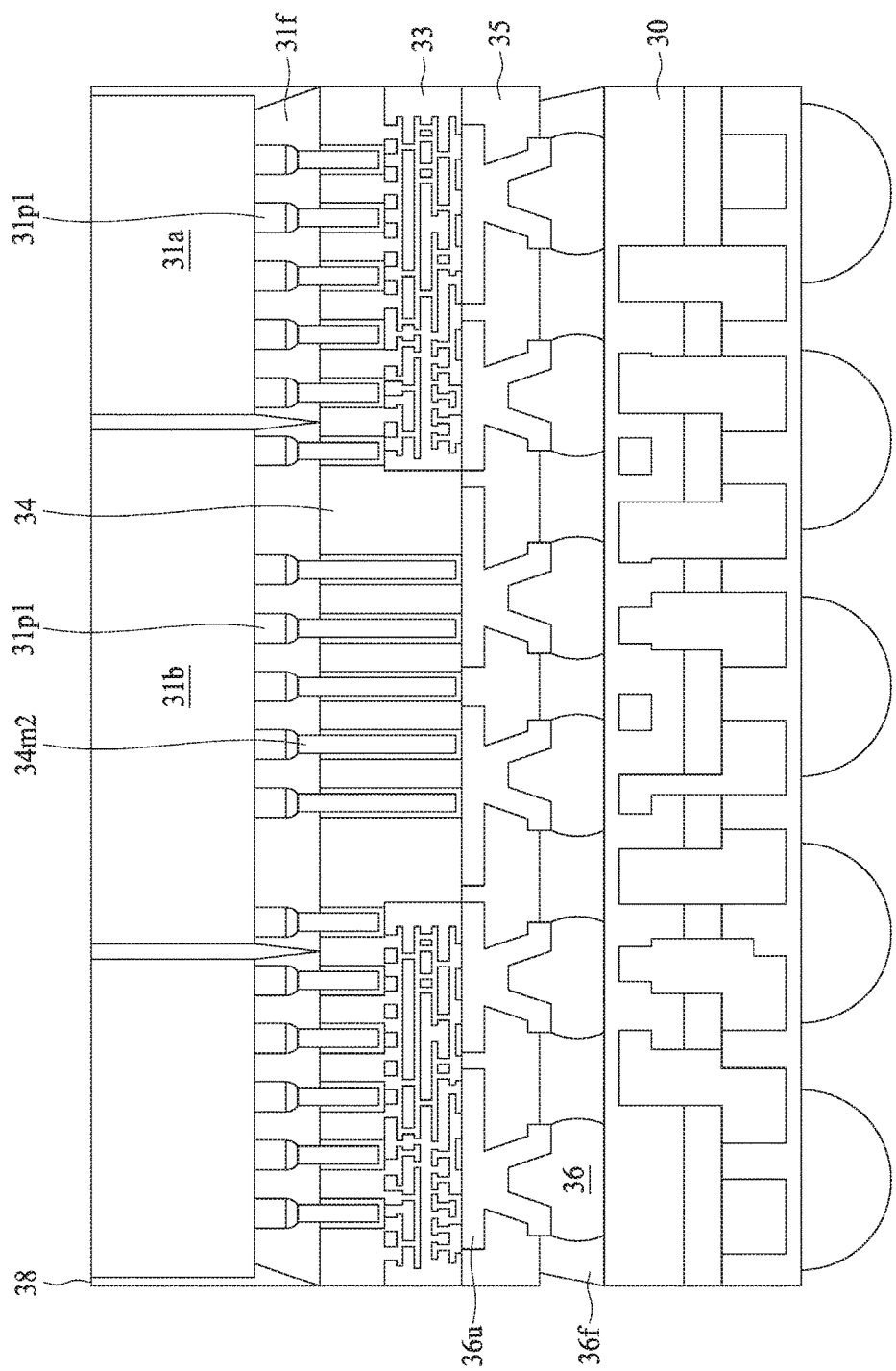

Referring to FIG. 3H, a passivation layer 35 is formed or disposed to cover a portion of the dielectric layer 34 and the interconnection layer 33 and to expose the conductive connections 34m2 and the conductive connections of the interconnection layer 33.

A conductive layer 36u (e.g., UBM) is formed or disposed to contact the exposed portion of the conductive connections 34m2 and the conductive connections of the interconnection layer 33. Electrical contacts 36 (e.g., a C4 pad) are formed or disposed on the conductive layer 36u. The electrical contact 36 is then formed or disposed on a substrate 30 to form the semiconductor package device 1 as shown in FIG. 1.

FIGS. 4A, 4B, 4C, 4D, 4E and 4F illustrate cross-sectional views of a semiconductor structure fabricated at various stages, in accordance with some embodiments of the present disclosure. Various figures have been simplified for a better understanding of the aspects of the present disclosure.

Figure 4A:
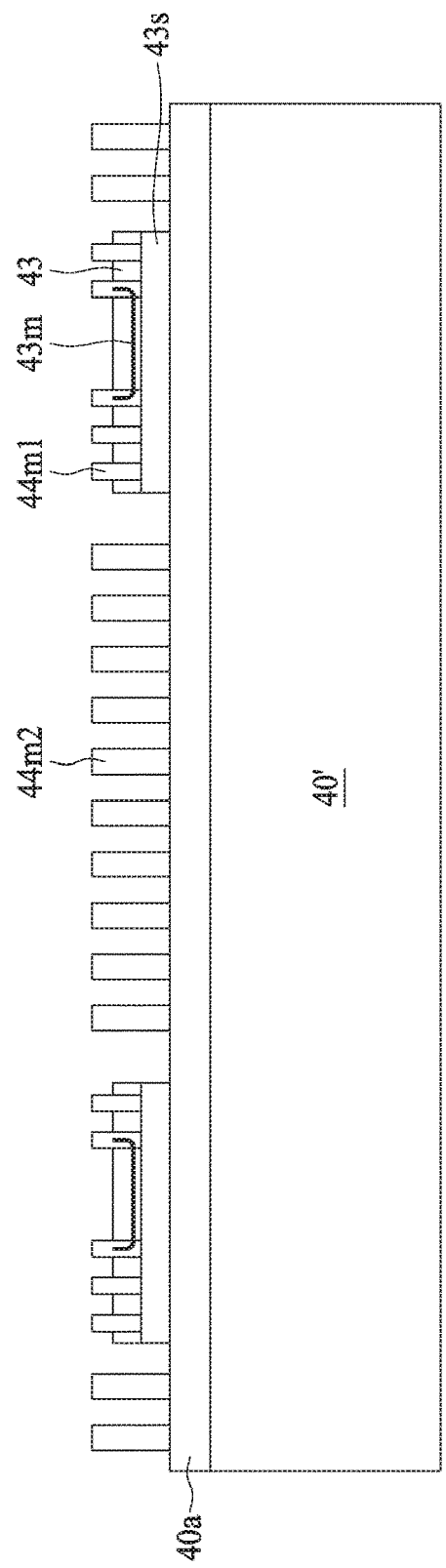
FIG. 4A, FIG. 4B, FIG. 4C, FIG. 4D, FIG. 4E and FIG. 4F illustrate a method of manufacturing a semiconductor package device in accordance with some embodiments of the present disclosure.

Referring to FIG. 4A, a carrier 40' is provided. In some embodiments, the carrier 40' may be a glass carrier or any other suitable carrier. An interconnection layer 43 is disposed over the carrier 40'. In some embodiments, the interconnection layer 43 is attached to the carrier 40' through an adhesive layer (or release film) 40a on the carrier 40'. In some embodiments, the interconnection layer 43 does not completely cover the carrier 40'. For example, the interconnection layer 43 covers a portion of the carrier 40' and exposes another portion of the carrier 40'.

The interconnection layer 43 includes a plurality of conductive connections 43m therein. In some embodiments, the conductive connections 43m of the interconnection layer 43 are fine-pitch interconnections or fine lines (e.g., less than about 1 µm). In some embodiments, a silicon layer 43s is disposed between the interconnection layer 43 and the carrier 40'.

Conductive connections (or conductive pillars) 44m1, 44m2 are formed or disposed on the carrier 40' and the interconnection layer 43. The conductive connection 44m1 electrically connects to the conductive connection 43m of the interconnection layer 43.

Figure 4B:
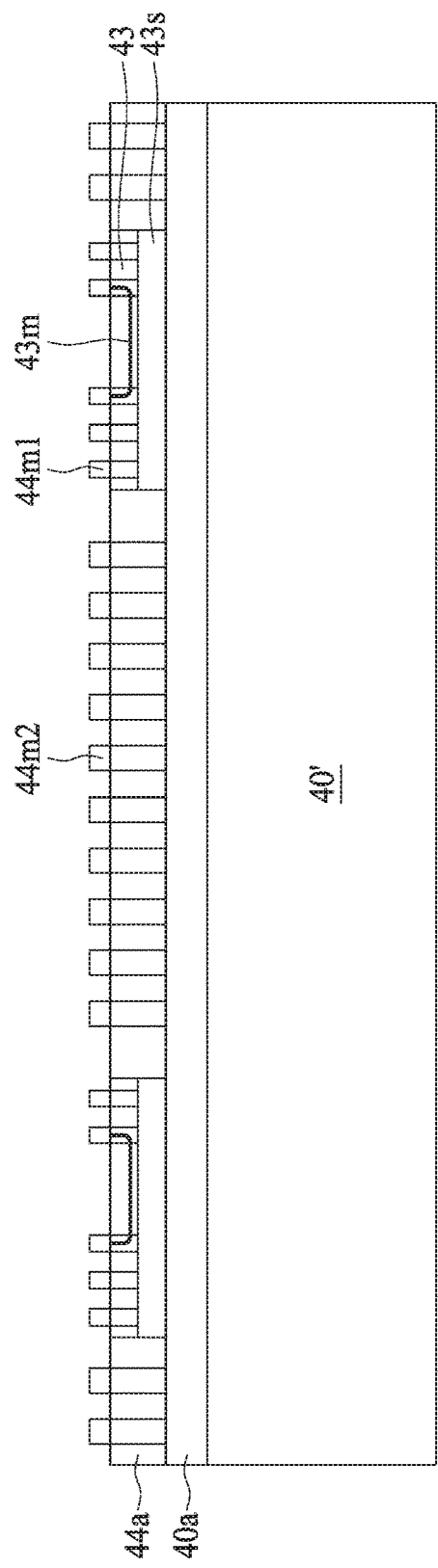

Referring to FIG. 4B, a package body 44a is formed or disposed to cover or encapsulate the interconnection layer 43 and conductive connections 44m1, 44m2. In some embodiments, the package body 44a includes an epoxy resin including fillers, a molding compound (e.g., an epoxy molding compound or other molding compound), a polyimide, a phenolic compound or material, a material including a silicone dispersed therein, or a combination thereof.

A portion of the package body 44a is then removed to expose the conductive connections 44m1, 44m2. For example, after a portion of the package body 44a is removed, the conductive connections 44m1, 44m2 are substantially coplanar with or higher than a top surface of the package body 44a.

Figure 4C:
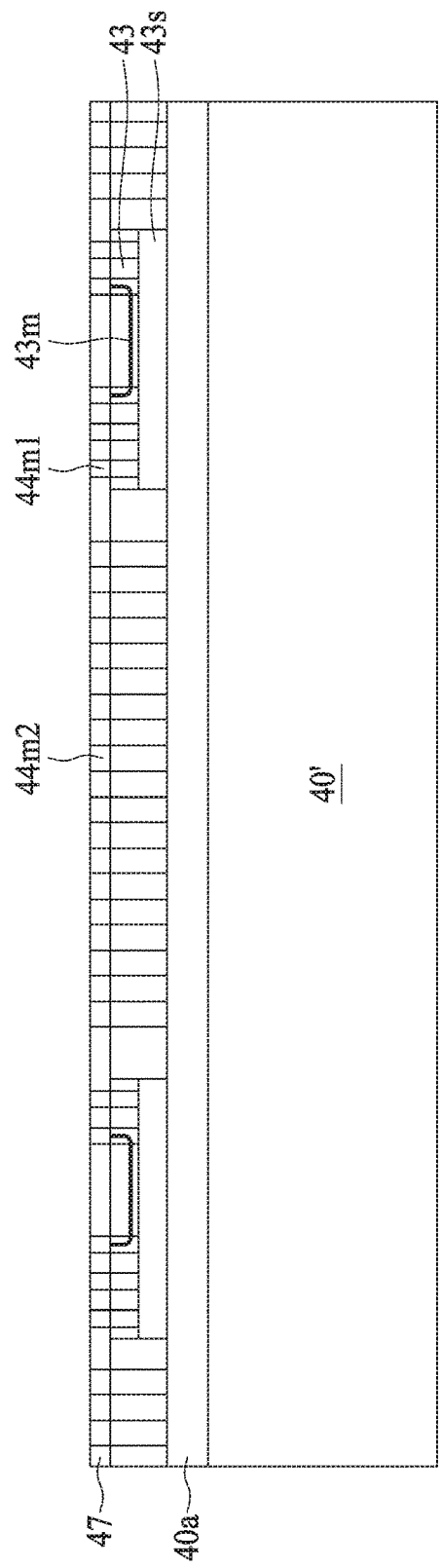

Referring to FIG. 4C, a dielectric layer 47 is formed or disposed on the interconnection layer 43 and the package body 44a. The dielectric layer includes electrical contacts (such as an RDL or micro-pads) to electrically connect the conductive connections 44m1, 44m2 to electronic components formed during the subsequent operations.

Figure 4D:
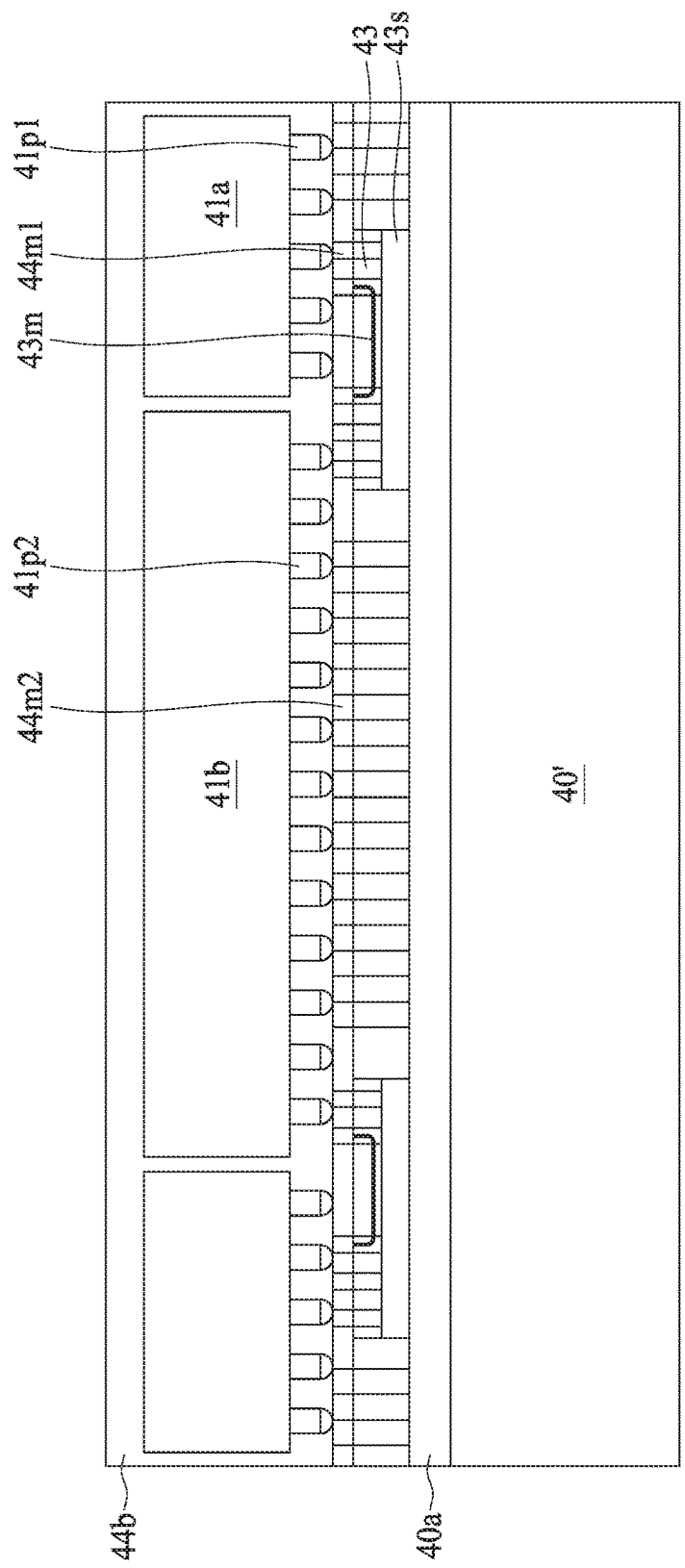

Referring to FIG. 4D, electronic components 41a, 41b are formed or disposed on the dielectric layer 47 and electrically connected to the electrical contacts of the dielectric layer 47. Each of the electronic components 41a, 41b includes a plurality of electrical contacts 41p1, 41p2 to provide electrical connections between the electronic components 41a, 41b and the electrical contacts of the dielectric layer 47. The electronic components 41a, 41b may be any suitable integrated circuit device including, but not limited to, a microprocessor (e.g., single or multi-core), a memory device, a chipset, a graphics device, or an ASIC according to several different embodiments. In some embodiments, the electronic component 41a is an HBM and the electronic component 41b is an ASIC.

A package body 44b is formed or disposed on the package body 44a to cover or encapsulate the electronic components 41a, 41b. In some embodiments, the package body 44b includes an epoxy resin including fillers, a molding compound (e.g., an epoxy molding compound or other molding compound), a polyimide, a phenolic compound or material, a material including a silicone dispersed therein, or a combination thereof. Then a reflow process may be carried out.

Figure 4E:
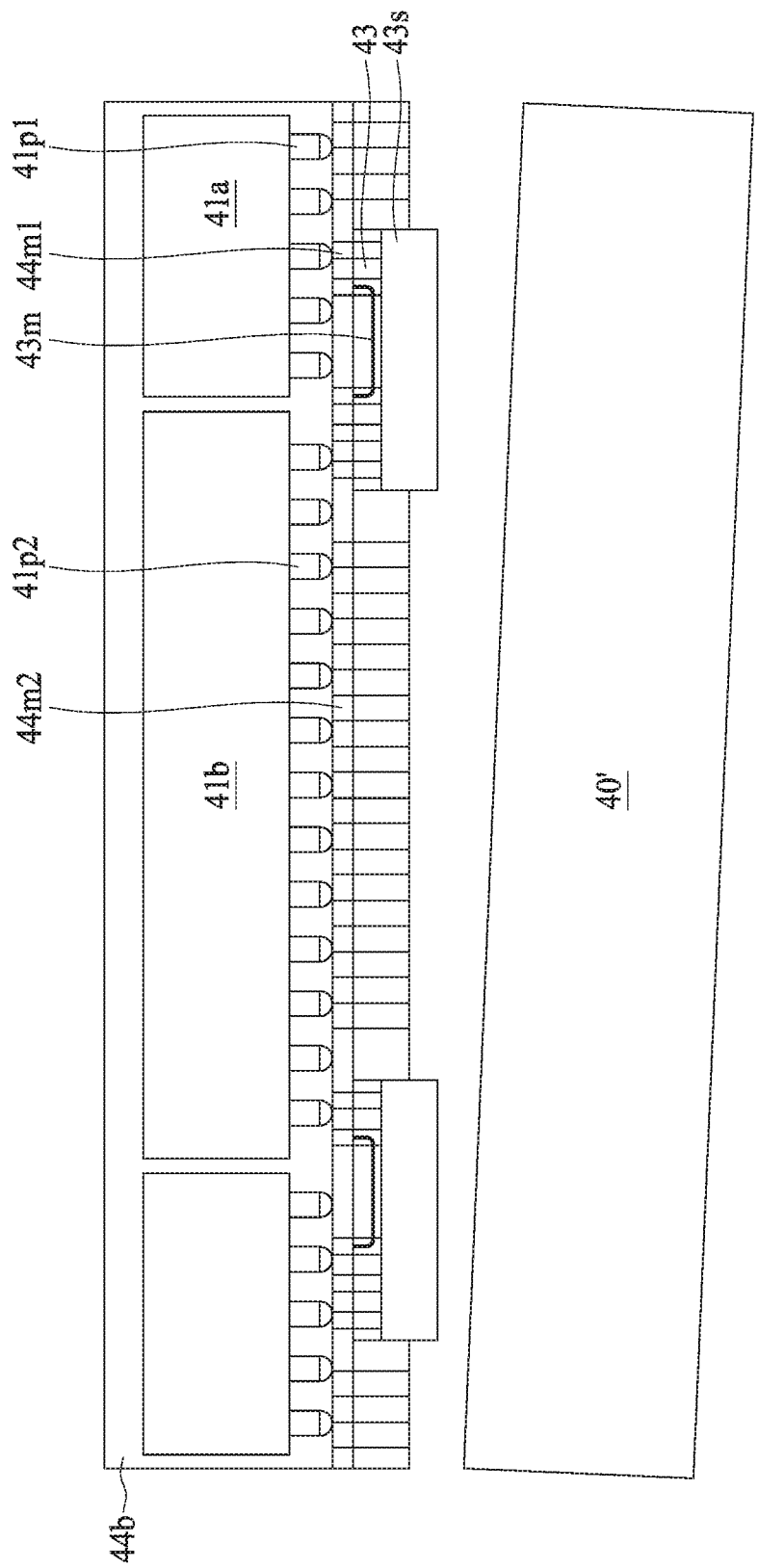

Referring to FIG. 4E, the carrier 40' is then removed from the package body 44a and the silicon layer 43s to expose the conductive connections 44m2 and the silicon layer 43s.

Figure 4F:
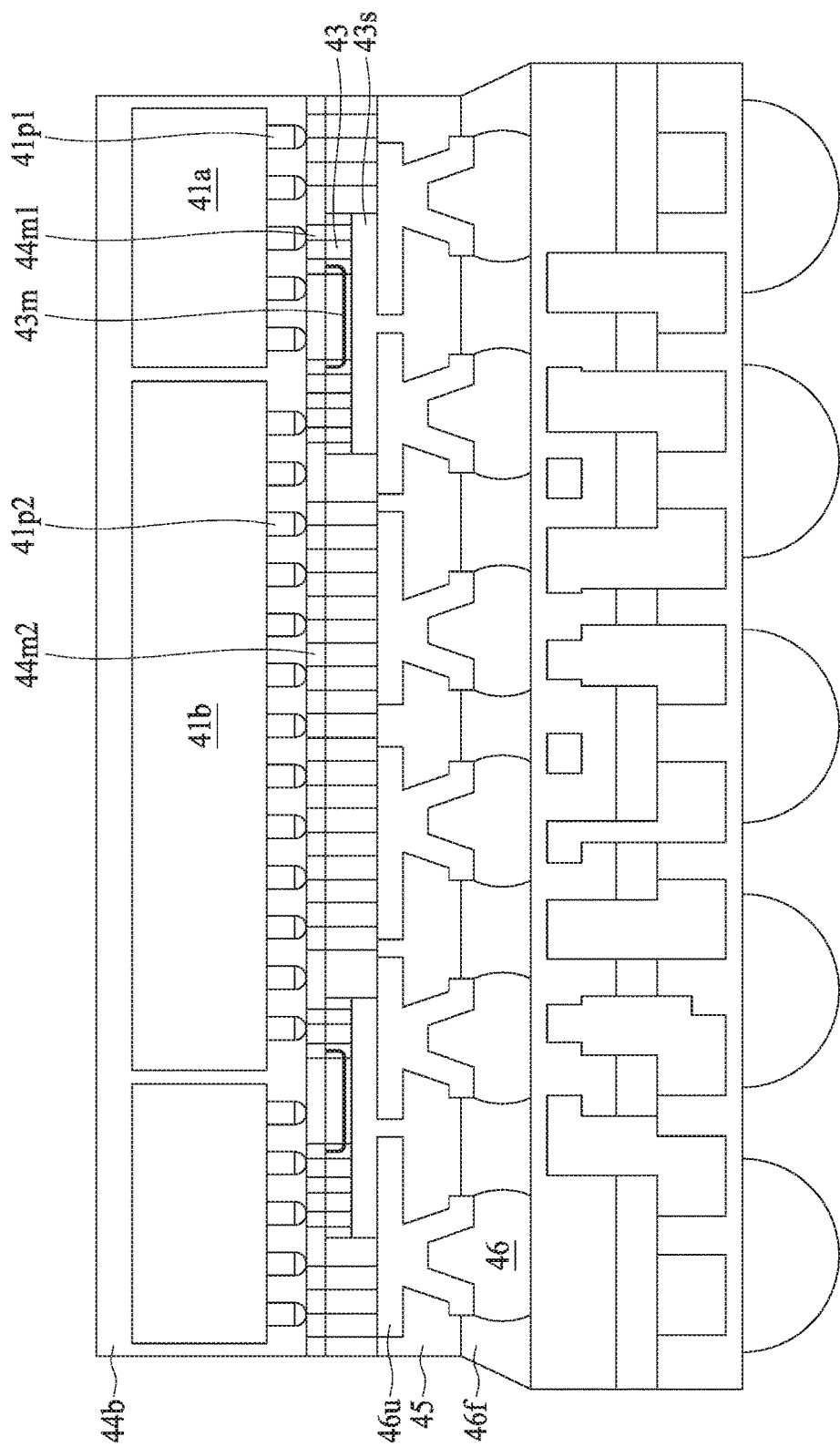

Referring to FIG. 4F, a passivation layer 45 is formed or disposed to cover a portion of the package body 44a and the silicon layer 43s and to expose a portion of the conductive connections 44m2 and silicon layer 43s. Conductive layer 46u (e.g., UBM) is formed or disposed to contact the exposed portion of the conductive connections 44m2 and the silicon layer 43s. Electrical contacts 46 (e.g., a C4 pad) are formed or disposed on the conductive layer 46u. The electrical contact 46 is then formed or disposed on a substrate 40 to form the semiconductor package device 2A as shown in FIG. 2A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device comprising:
a first interconnection structure having a first pitch;
a non-silicon interposer surrounding the first interconnection structure, the non-silicon interposer comprising a second interconnection structure and a third interconnection structure disposed on the first interconnection structure, wherein the second interconnection structure has a second pitch and the third interconnection structure has a third pitch, and wherein the second pitch or the third pitch is larger than the first pitch; and
a first die above the first interconnection structure and electrically connected to the first interconnection structure.

2. The semiconductor package device of claim 1, wherein the first die is connected to the first interconnection structure through the third interconnection structure.

3. The semiconductor package device of claim 1, further comprising a second die, wherein the second die is electrically connected to the first interconnection structure and the second interconnection structure.

4. The semiconductor package device of claim 1, wherein the non-silicon interposer is an organic interposer or a molding compound.

5. The semiconductor package device of claim 1, wherein a density of the first interconnection structure is larger than a density of the second interconnection structure.

6. The semiconductor package device of claim 1, a thickness of the first interconnection structure is in a range from about 10 micrometers (μm) to about 20 μm.

7. The semiconductor package device of claim 1, further comprising a carrier on which the first interconnection structure is disposed.

8. The semiconductor package device of claim 1, wherein a top surface of the third interconnection structure is substantially coplanar with a top surface of the second interconnection structure.

9. The semiconductor package device of claim 1, wherein a diameter of the third interconnection structure is less than a diameter of the second interconnection structure.

10. The semiconductor package device of claim 1, wherein the third interconnection structure is electrically connected to the first interconnection structure and the second interconnection structure.

11. A semiconductor system comprising:
   a fan-out semiconductor package device, comprising;
   a first interconnection structure having a first pitch; and
   a non-silicon interposer surrounding the first interconnection structure, the non-silicon interposer comprising a second interconnection structure having a second pitch;
   a first die electrically connected to the fan-out semiconductor package device; and
   a second die electrically connected to the first die through the fan-out semiconductor package device.

12. The system of claim 11, wherein the first pitch is less than the second pitch.

13. The system of claim 11, wherein the first die is electrically connected to the first interconnection structure.

14. The system of claim 13, wherein the second die is electrically connected to the first interconnection structure and the second interconnection structure.

15. A method of manufacturing a semiconductor package device, comprising:
   providing a carrier and a release film;
   disposing a first interconnection structure and a silicon base on the carrier;
   disposing a non-silicon interposer over the first interconnection structure;
   disposing a second interconnection structure over the first interconnection structure and the non-silicon interposer;
   connecting a first die to the second interconnection structure; and
   connecting a second die to the second interconnection structure.

16. The method of claim 14, further comprising disposing a seed layer on the release film.

17. The method of claim 14, further comprising removing a portion of the silicon base.

18. The method of claim 14, further comprising disposing a first conductive element on the first interconnection structure and disposing a second conductive element in the non-silicon interposer simultaneously.

* * * * *